(12) United States Patent
Takagi

(10) Patent No.: US 10,063,031 B2
(45) Date of Patent: Aug. 28, 2018

(54) METHOD FOR MANUFACTURING OPTICAL DEVICE

(71) Applicant: Mitsubishi Electric Corporation, Tokyo (JP)

(72) Inventor: Kazuhisa Takagi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/460,258

(22) Filed: Mar. 16, 2017

(65) Prior Publication Data

US 2018/0041008 A1 Feb. 8, 2018

(30) Foreign Application Priority Data

Aug. 8, 2016 (JP) .................................. 2016-155807

(51) Int. Cl.
*H01L 21/00* (2006.01)
*H01S 5/12* (2006.01)
(Continued)

(52) U.S. Cl.
CPC ................ *H01S 5/12* (2013.01); *G02B 6/136* (2013.01); *H01S 5/0203* (2013.01); *H01S 5/026* (2013.01);
(Continued)

(58) Field of Classification Search
CPC .......... H01S 5/12; H01S 5/0203; H01S 5/026; G02B 6/136; G02B 2006/12126;
(Continued)

(56) References Cited

U.S. PATENT DOCUMENTS 5,459,747 A * 10/1995 Takiguchi .............. B82Y 20/00
372/102
9,293,892 B2 * 3/2016 Nakayama ............ H01S 5/0604
(Continued)

FOREIGN PATENT DOCUMENTS

JP Hei09-092921 A 4/1997
JP Hei11-145557 A 5/1999

OTHER PUBLICATIONS

K. Iga ed. "Semiconductor Laser", Applied Physics Series, Ohmsha, Ltd., Oct. 25, 1994, pp. 366-368.

*Primary Examiner* — Ismail Muse
(74) *Attorney, Agent, or Firm* — Studebaker & Brackett PC

(57) ABSTRACT

A diffraction grating pattern is formed in the first insulating film on the active layer by electron beam lithography, and at the same time an end facet formation pattern whose end portion corresponds to a position of an emission end facet of the optical modulator is formed in the first insulating film on the optical absorption layer by electron beam lithography. A second insulating film is formed on the end facet formation pattern. The diffraction grating formation layer is etched using the first and second insulating films as masks to form a diffraction grating, and is embedded with an embedded layer. The second insulating film is removed. A third insulating film is formed on the diffraction grating and the embedded layer not to cover the end facet formation pattern. The optical absorption layer is etched using the first and third insulating films as masks to form the emission end facet.

5 Claims, 16 Drawing Sheets

(51) Int. Cl.
*G02B 6/136* (2006.01)
*H01S 5/026* (2006.01)
*H01S 5/02* (2006.01)
*G02B 6/12* (2006.01)

(52) U.S. Cl.
CPC .............. *G02B 2006/12097* (2013.01); *G02B 2006/12107* (2013.01); *G02B 2006/12121* (2013.01); *G02B 2006/12126* (2013.01); *G02B 2006/12142* (2013.01); *G02B 2006/12161* (2013.01); *G02B 2006/12173* (2013.01); *G02B 2006/12176* (2013.01)

(58) Field of Classification Search
CPC ........... G02B 2006/12176; G02B 2006/12142; G02B 2006/12107; G02B 2006/12097; G02B 2006/12173; G02B 2006/12121; G02B 2006/12161
See application file for complete search history.

(56) References Cited

U.S. PATENT DOCUMENTS

| | | | |
|---|---|---|---|
| 2004/0179569 A1* | 9/2004 | Sato | H01S 5/06256 372/50.11 |
| 2010/0142571 A1* | 6/2010 | Park | B82Y 20/00 372/26 |
| 2012/0058581 A1* | 3/2012 | Tsuji | H01S 5/12 438/31 |
| 2012/0270347 A1* | 10/2012 | Yagi | H01S 5/1231 438/31 |
| 2014/0154822 A1* | 6/2014 | Park | H01S 5/06258 438/31 |
| 2015/0093115 A1* | 4/2015 | Uchiyama | H04J 14/02 398/82 |
| 2016/0164257 A1* | 6/2016 | Adachi | H01S 5/1231 385/14 |
| 2017/0170631 A1* | 6/2017 | Chimot | H01S 5/1225 |
| 2017/0293085 A1* | 10/2017 | Matsuda | G02B 6/34 |

* cited by examiner

METHOD FOR MANUFACTURING OPTICAL DEVICE

BACKGROUND OF THE INVENTION

Field

The present invention relates to a method for manufacturing an optical device such as an electric field absorption type optical modulator integrated semiconductor laser.

Background

As a semiconductor device used for a high-speed, large capacity optical communication system, an optical device is known in which a semiconductor laser, an electric field absorption type optical modulator and a window section are integrated (e.g., see Patent Literature 1 (FIG. 1)). A distributed feedback (DFB) laser is used for a semiconductor laser for such an optical device and it is known that phase control of modulated returning light in a region where a diffraction grating is located is important (e.g., see Non Patent Literature 1). As a method for manufacturing a diffraction grating, it is known that electron beam (EB) lithography is used to form a diffraction grating pattern (e.g., see Patent Literature 1 (paragraph 0010)).

Patent Literature 1: JP H09-092921 A
Patent Literature 2: JP H 11-145557 A
Non Patent Literature 1: "Semiconductor Laser," written and edited by Kenichi Iga, compiled by The Japan Society of Applied Physics, Ohmsha, Ltd., 1994 (especially, p. 366 to p. 368, FIG. 17•12)

FIG. 32 is a plan view illustrating an electric field absorption type optical modulator integrated semiconductor laser. CW light generated in a DFB laser is modulated by applying a modulation electric signal to the electric field absorption type optical modulator. A window section is provided between a front end facet of an optical device and an emission end facet of the optical modulator to reduce returning light from the front end facet of the optical device. However, the returning light from the emission end facet of the optical modulator which is an interface between the optical modulator and the window section enters an active region of the DFB laser. Depending on the phase of this light, hole burning in the DFB laser increases and a variation in a laser oscillating wavelength increases, resulting in a problem that a transmission characteristic deteriorates.

According to prior arts, a diffraction grating pattern is formed by electron beam lithography and patterns of other regions are formed using a glass mask. For this reason, accuracy of alignment of a distance between an end of the diffraction grating and an emission end of the optical modulator is not sufficient for the wavelength of light and it is difficult to control the phase of light when reflected light from the emission end of the optical modulator enters the DFB laser.

SUMMARY

The present invention has been implemented to solve the above-described problems and it is an object of the present invention to provide a method for manufacturing an optical device capable of controlling a distance between an end of a diffraction grating and an emission end facet of an optical modulator at nm levels.

According to the present invention, a method for manufacturing an optical device includes: forming an active layer and a diffraction grating formation layer which become a DFB laser in order on a substrate; removing part of the active layer and the diffraction grating formation layer and forming an optical absorption layer which becomes an optical modulator butt-jointed to the active layer on the substrate; forming a first insulating film on the diffraction grating formation layer and the optical absorption layer; forming a diffraction grating pattern in the first insulating film on the active layer by electron beam lithography, and at the same time forming an end facet formation pattern whose end portion corresponds to a position of an emission end facet of the optical modulator in the first insulating film on the optical absorption layer by electron beam lithography; forming a second insulating film on the end facet formation pattern of the first insulating film; etching the diffraction grating formation layer using the first and second insulating films as masks to form a diffraction grating; removing the first insulating film on the diffraction grating and embedding the diffraction grating with an embedded layer while leaving the first and second insulating films on the optical absorption layer; removing the second insulating film and forming a third insulating film on the diffraction grating and the embedded layer not to cover the end facet formation pattern; and etching the optical absorption layer using the first and third insulating films as masks to form the emission end facet of the optical modulator.

In the present invention, the diffraction grating pattern is formed by electron beam lithography and at the same time, the end facet formation pattern whose end portion corresponds to the position of the emission end facet of the optical modulator is formed by electron beam lithography. It is thereby possible to control the distance between the end of the diffraction grating 3 and the emission end facet of the optical modulator at nm levels. Therefore, it is possible to obtain an electric field absorption type optical modulator integrated DFB laser with a small wavelength change under the influence of returning light by controlling the phase of light when reflected light from the emission end facet of the optical modulator enters the DFB laser.

Other and further objects, features and advantages of the invention will appear more fully from the following description.

DESCRIPTION OF EMBODIMENTS

A method for manufacturing an optical device according to the embodiments of the present invention will be described with reference to the drawings. The same components will be denoted by the same symbols, and the repeated description thereof may be omitted.

First Embodiment

Figure 1:
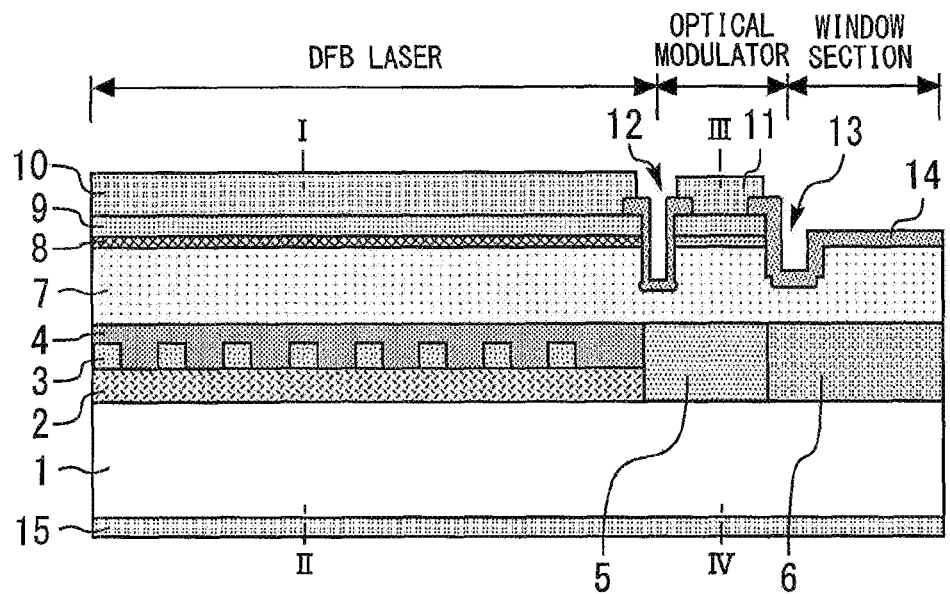
FIG. 1 is a cross-sectional view along a light propagation direction illustrating an optical device according to a first embodiment of the present invention.

FIG. 1 is a cross-sectional view along a light propagation direction illustrating an optical device according to a first embodiment of the present invention. In the optical device according to the present embodiment, a DFB laser, an optical modulator and a window section are arranged side by side in order and integrated.

In the DFB laser, an active layer 2 of InGaAsP-MQW or AlGaInAs-MQW and a diffraction grating 3 of p-InGaAsP are formed in order on an n-InP substrate 1. The diffraction grating 3 is embedded with a p-InP embedded layer 4. In the optical modulator, an optical absorption layer 5 of InGaAsP-MQW or AlGaInAs-MQW is formed on the n-InP substrate 1. The optical absorption layer 5 is butt-jointed to the active layer 2. In the window section, an InP layer 6 is formed on the n-InP substrate 1.

An upper cladding layer 7 of p-InP is formed on the embedded layer 4, the optical absorption layer 5 and the InP layer 6. A p-InGaAsP layer 8 and a contact layer 9 of p-InGaAs (P) are formed in order on the upper cladding layer 7 in the DFB laser and the optical modulator. An anode electrode 10 is formed on the contact layer 9 in the DFB laser. An anode electrode 11 is formed on the contact layer 9 in the optical modulator. The anode electrodes 10 and 11 are Ti/Pt/Au or the like. A mesa 12 for electrical isolation is formed between the DFB laser and the optical modulator, and a mesa 13 is formed between the optical modulator and the window section. The surface except the surfaces of the anode electrodes 10 and 11 is covered with an insulating film 14 of $SiO_2$ or the like. A cathode electrode 15 of AuGe/Ni/Tl/Pt/Ti/Pt/Au or the like is formed on the back of the n-InP substrate 1.

Figure 2:
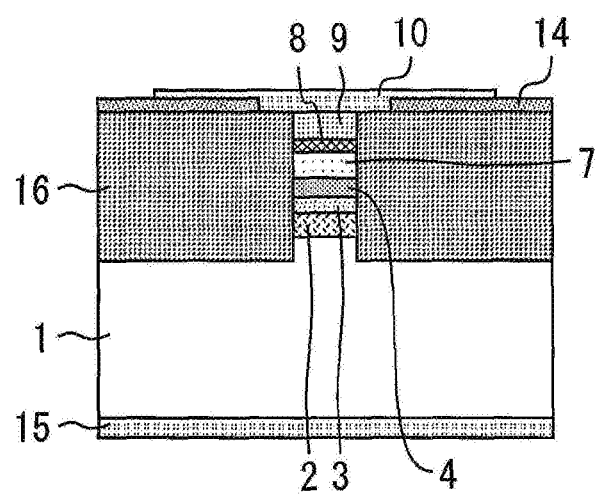
FIG. 2 is a cross-sectional view along I-II in FIG. 1.
Figure 3:
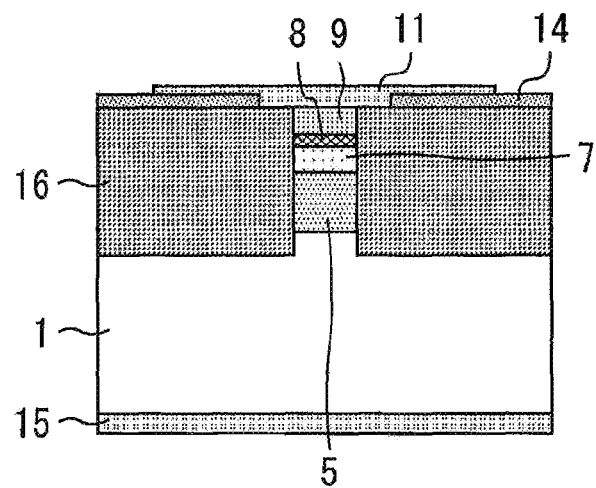
FIG. 3 is a cross-sectional view along III-IV in FIG. 1.

FIG. 2 is a cross-sectional view along I-II in FIG. 1 and FIG. 3 is a cross-sectional view along III-IV in FIG. 1. In the DFB laser and the optical modulator, the upper cladding layer 7 or the like is dry-etched and a vertical ridge type structure is formed. Both sides of the vertical ridge type structure are embedded with a semi-insulating InP embedded layer 16.

Next, a method for manufacturing the optical device according to the present embodiment will be described. FIGS. 4, 6, 8, 10, 12, 14, 16 and 18 are cross-sectional views illustrating the method for manufacturing the optical device according to the first embodiment of the present invention. FIGS. 5, 7, 9, 11, 13, 15, 17 and 19 are plan views illustrating the method for manufacturing the optical device according to the first embodiment of the present invention.

Figure 4:
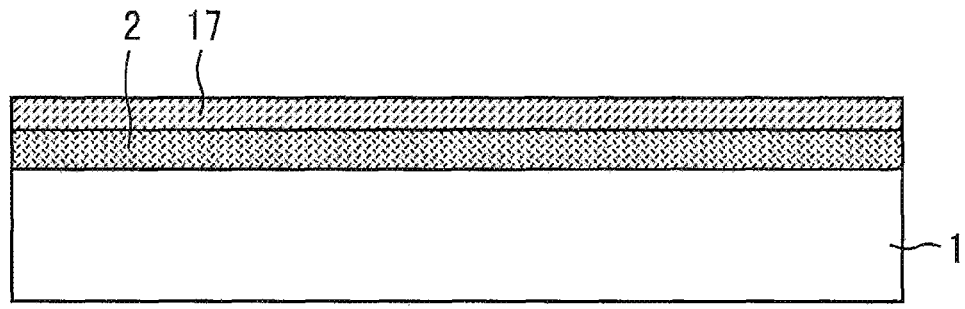
FIGS. 4, 6, 8, 10, 12, 14, 16 and 18 are cross-sectional views illustrating the method for manufacturing the optical device according to the first embodiment of the present invention.
Figure 5:
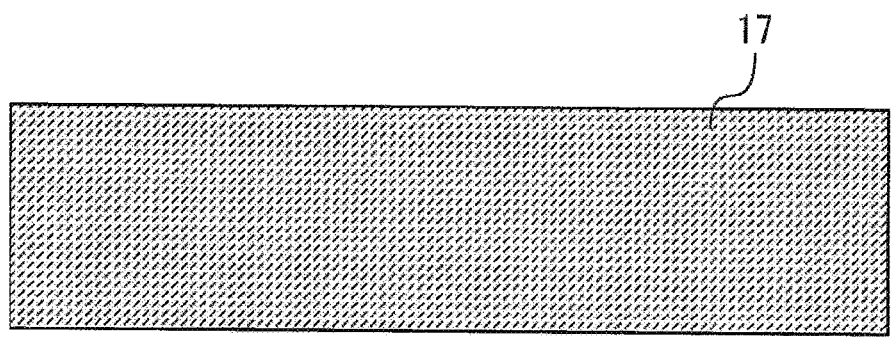
FIGS. 5, 7, 9, 11, 13, 15, 17 and 19 are plan views illustrating the method for manufacturing the optical device according to the first embodiment of the present invention.
Figure 6:
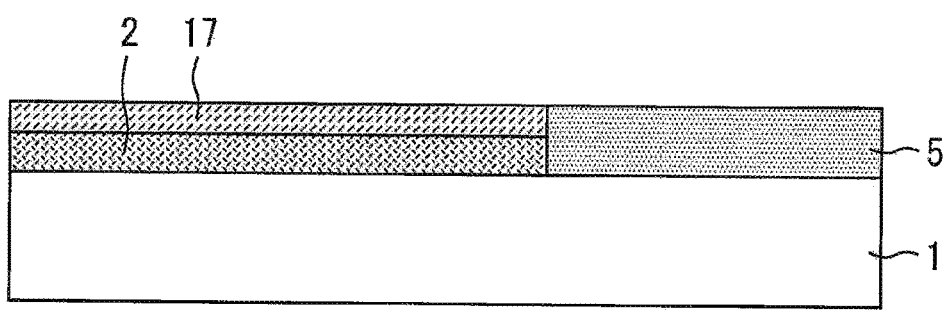
Figure 7:
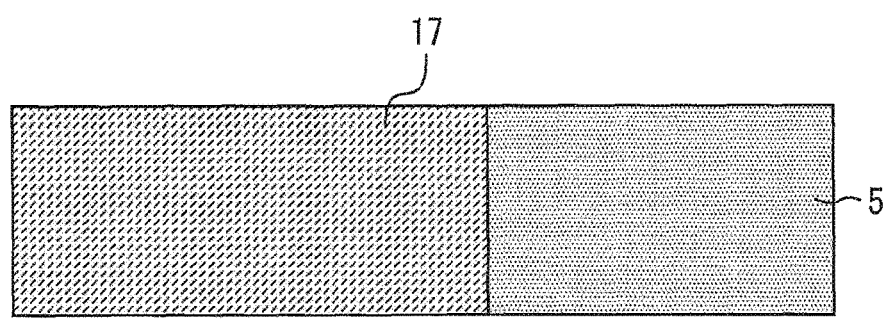

First, as shown in FIG. 4 and FIG. 5, the active layer 2 and a diffraction grating formation layer 17 which become the DFB laser are formed in order on the n-InP substrate 1. Next, as shown in FIG. 6 and FIG. 7, part of the active layer 2 and the diffraction grating formation layer 17 is removed and the optical absorption layer 5 which becomes the optical modulator butt-jointed to the active layer 2 is formed on the n-InP substrate 1.

Figure 8:
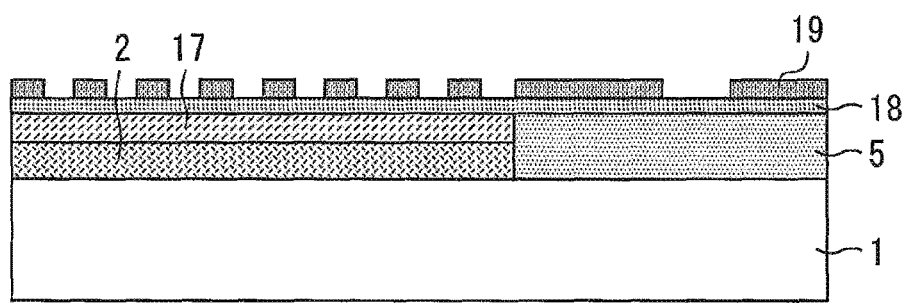
Figure 9:
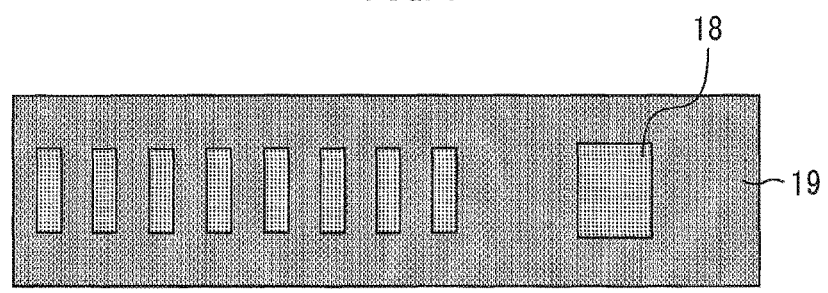
Figure 10:
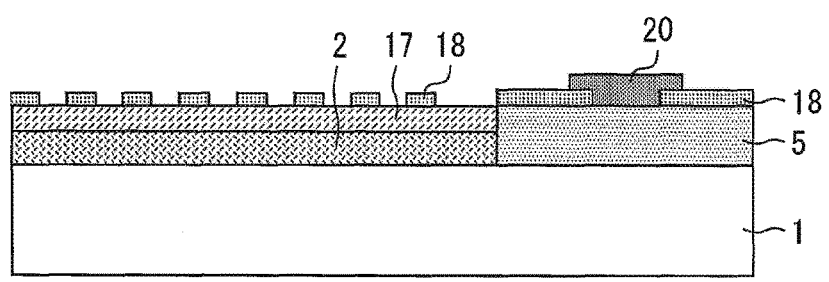
Figure 11:
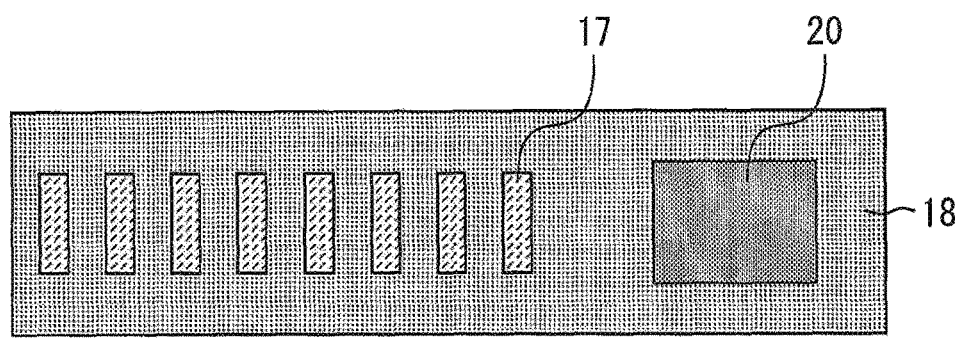

Next, as shown in FIG. 8 and FIG. 9, a first insulating film 18 of $SiO_2$ is formed on the diffraction grating formation layer 17 and the optical absorption layer 5. A resist 19 is formed on the first insulating film 18 and the resist 19 is patterned by electron beam lithography. Next, as shown in FIG. 10 and FIG. 11, the first insulating film 18 is etched using the resist 19 as a mask. By this means, a diffraction grating pattern is formed in the first insulating film 18 on the active layer 2 by electron beam lithography, and at the same time an end facet formation pattern whose end portion corresponds to the position of the emission end facet of the optical modulator is formed in the first insulating film 18 on the optical absorption layer 5 by electron beam lithography. After that, the resist 19 is removed and a second insulating film 20 of SiN is formed on the end facet formation pattern of the first insulating film 18.

Figure 12:
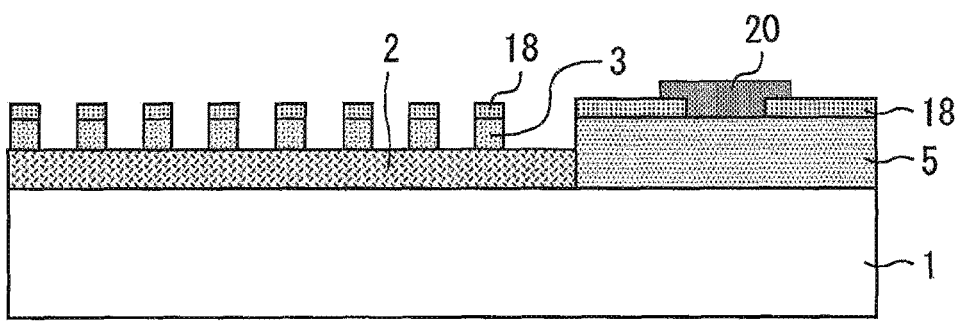
Figure 13:
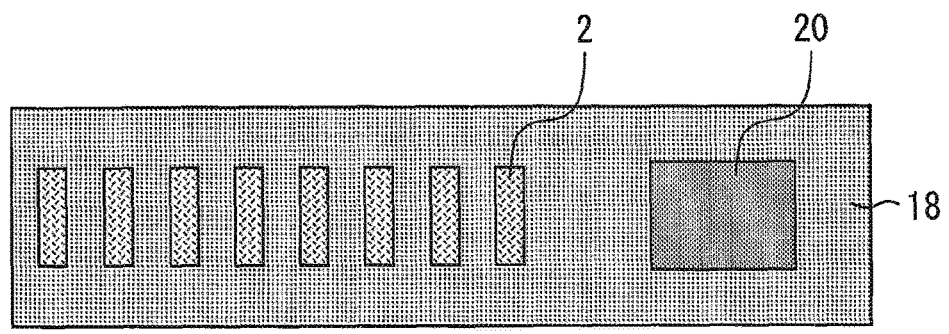
Figure 14:
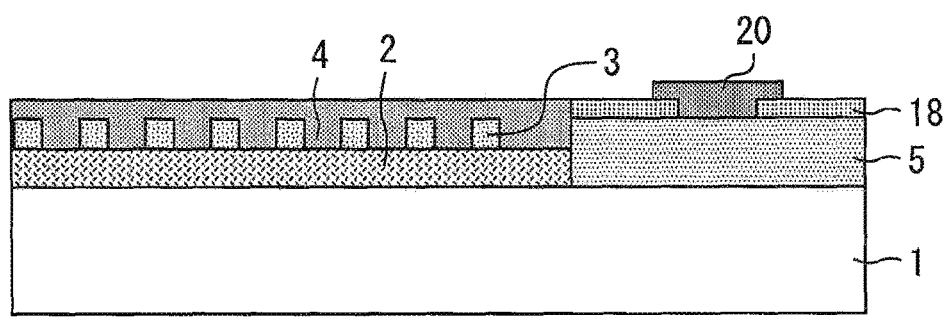
Figure 15:
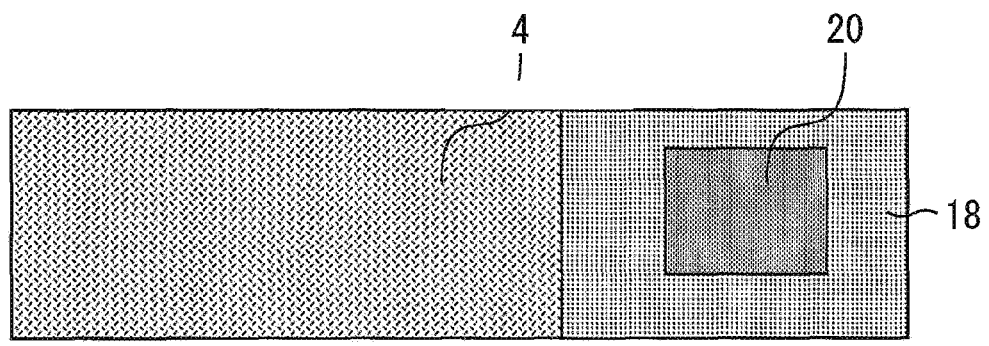

Next, as shown in FIG. 12 and FIG. 13, the diffraction grating formation layer 17 is etched using the first and second insulating films 18 and 20 as masks to form the diffraction grating 3. Next, as shown in FIG. 14 and FIG. 15, the first insulating film 18 on the diffraction grating 3 is removed and the diffraction grating 3 is embedded with the embedded layer 4 while leaving the first and second insulating films 18 and 20 on the optical absorption layer 5.

Figure 16:
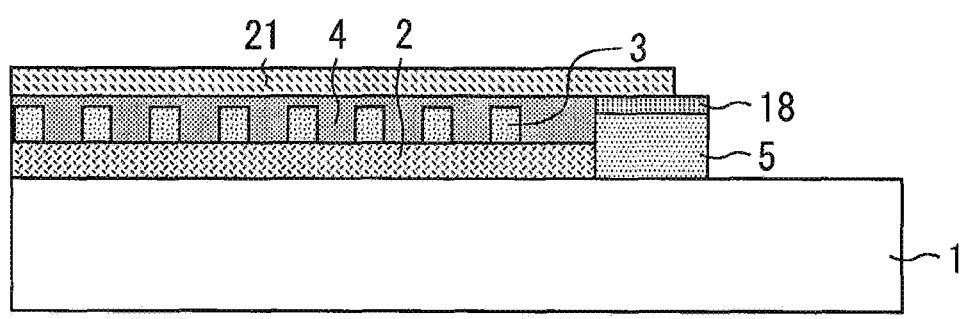
Figure 17:
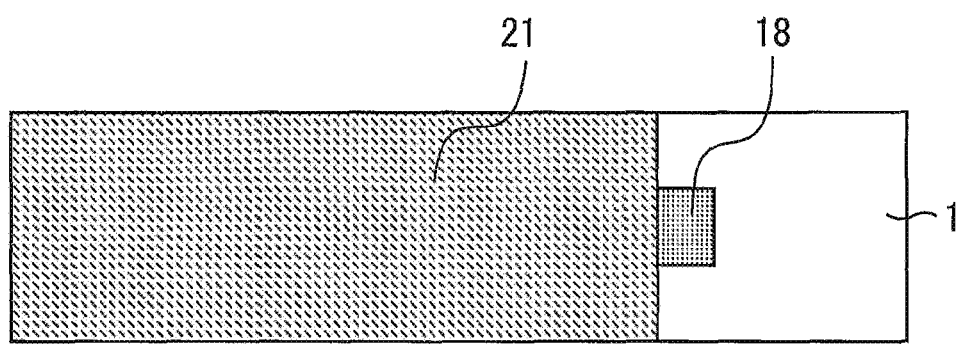

Next, as shown in FIG. 16 and FIG. 17, the second insulating film 20 is removed and a third insulating film 21 of SiN is formed on the diffraction grating 3 and the embedded layer 4 so as not to cover the end facet formation pattern. Using a hydrofluoric acid-based solution, without etching the third insulating film 21 of SiN, the first insulating film 18 of $SiO_2$ is selectively etched and patterned. However, an end portion of the end facet formation pattern of the first insulating film 18 corresponding to the position of the emission end facet of the optical modulator is not etched. The optical absorption layer 5 is etched up to a depth where the window section is formed using the first and third insulating films 18 and 21 as masks to form an emission end facet of the optical modulator.

Figure 18:
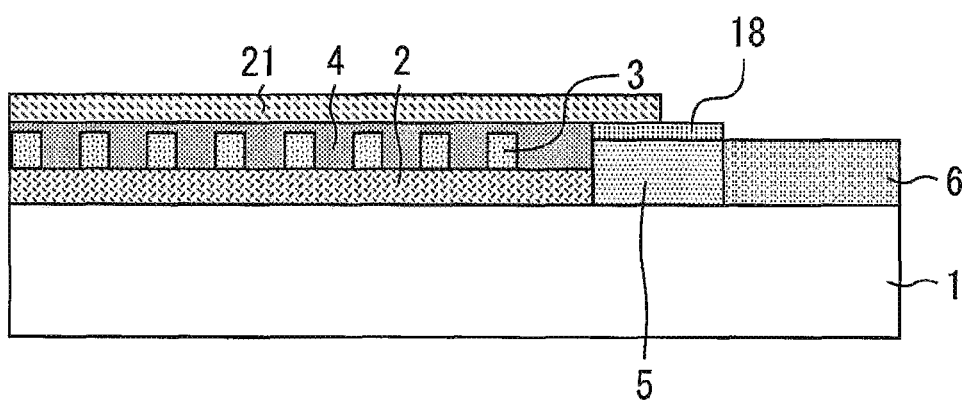
Figure 19:
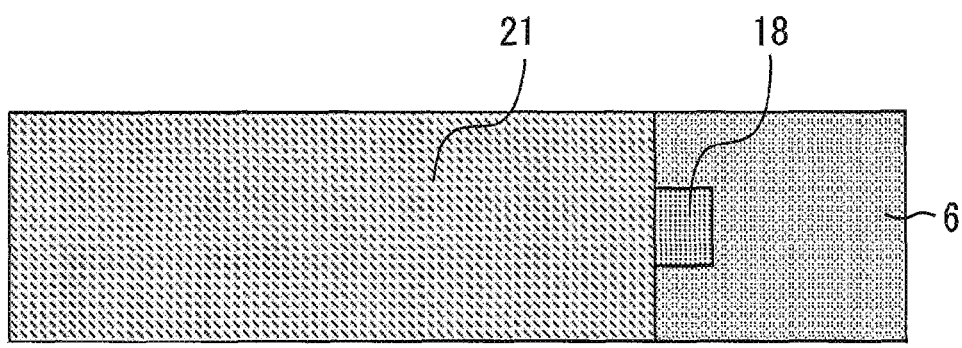

Next, as shown in FIG. 18 and FIG. 19, the p-type or undoped InP layer 6 is embedded in the portion where the optical absorption layer 5 is etched to form the window section. After that, the upper cladding layer 7 or the like is formed on the active layer 2 and dry-etching it to form a vertical ridge type structure.

In the present embodiment, the diffraction grating pattern is formed by electron beam lithography and at the same time, the end facet formation pattern whose end portion corresponds to the position of the emission end facet of the optical modulator is formed by electron beam lithography. It is thereby possible to control the distance between the end of the diffraction grating 3 and the emission end facet of the optical modulator at nm levels. Therefore, it is possible to obtain an electric field absorption type optical modulator integrated DFB laser with a small wavelength change under the influence of returning light by controlling the phase of light when reflected light from the emission end facet of the optical modulator enters the DFB laser.

More specifically, the distance L between the end of the diffraction grating 3 and the emission end facet of the optical modulator is set as follows.

$$L=(m+a)\lambda/2$$

where $\lambda$ is a guide wavelength of laser light, m is an integer and $0.4 \leq a \leq 0.6$. By setting the distance L as described above, the phase of returning light when the returning light from the emission end facet of the optical modulator enters the active region of the DFB laser becomes approximately +90° or −90° with respect to a standing wave in the DFB laser (e.g., see Non Patent Literature 1 (FIG. 17•12)). For this reason, hole burning in the DFB laser never increases and the change of the oscillating wavelength of the laser decreases, never resulting in a problem that the transmission characteristic deteriorates.

Using the manufacturing method of the present embodiment, it is possible to implement high accuracy alignment which would have been impossible in the case of manufacturing by determining the position of the emission end facet of the optical modulator using only a conventional glass mask. Since Patent Literature 2 uses a micro-loading effect, it is necessary to increase the etching mask window section, whereas the present embodiment includes no such constraint.

The vertical ridge type structure is formed using dry etching unlike a reverse mesa ridge structure which is formed using an unstable manufacturing method such as wet etching. Therefore, a variation in the effective refractive index caused by a manufacturing variation is small, and so the error of control over the phase of returning light decreases.

Note that instead of the window section having the InP layer 6, a passive waveguide having an undoped InGaAsP optical waveguide core layer may be formed.

Second Embodiment

An optical device according to the present embodiment includes no window section, and includes the DFB laser and the optical modulator arranged side by side in order and integrated, compared to the first embodiment. An emission end of the optical modulator is assumed to be a front end facet of the optical device. This front end facet is formed not by cleavage but by etching.

A method for manufacturing an optical device according to the present embodiment is similar to steps in FIG. 4 to FIG. 17 according to the first embodiment. However, the distance L between the end of the diffraction grating 3 and the emission end facet of the optical modulator is set as follows.

$$L=(m+a)\lambda/2$$

where $\lambda$ is a guide wavelength of laser light, m is an integer, $0.4-b \leq a \leq 0.6-b$, and b is a returning light phase of the front end facet where a multi-layer coated insulating film is provided. This makes it possible to obtain effects similar to those of the first embodiment.

Third Embodiment

An optical device according to the present embodiment includes no optical modulator and includes the DFB laser and the window section arranged side by side in order and integrated, compared to the first embodiment. The emission end of the window section is assumed to be the front end facet of the optical device. This front end facet is formed not by cleavage but by etching.

FIGS. 20, 22, 24, 26, 28 and 30 are cross-sectional views illustrating a method for manufacturing an optical device according to a third embodiment of the present invention. FIGS. 21, 23, 25, 27, 29 and 31 are plan views illustrating the method for manufacturing the optical device according to the third embodiment of the present invention.

Figure 20:
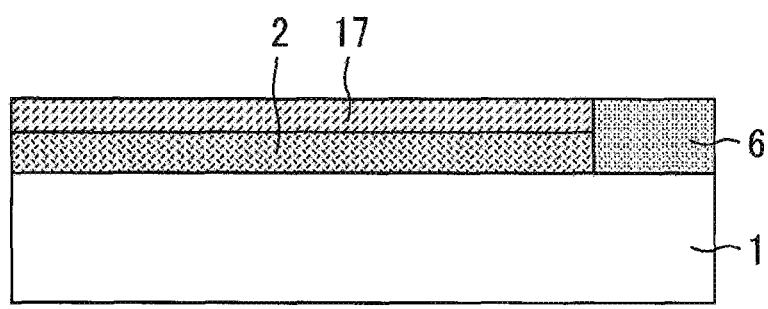
FIGS. 20, 22, 24, 26, 28 and 30 are cross-sectional views illustrating a method for manufacturing an optical device according to a third embodiment of the present invention.
Figure 21:
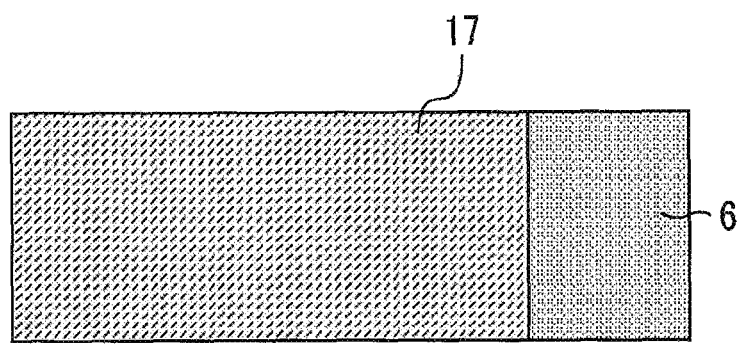
FIGS. 21, 23, 25, 27, 29 and 31 are plan views illustrating the method for manufacturing the optical device according to the third embodiment of the present invention.

As in the cases of FIG. 4 and FIG. 5 of the first embodiment, the active layer 2 and the diffraction grating formation layer 17 which become the DFB laser are formed in order on the n-InP substrate 1. Next, as shown in FIG. 20 and FIG. 21, part of the active layer 2 and the diffraction grating formation layer 17 is removed and the p-type or undoped InP layer 6 which becomes a window section butt-jointed to the active layer 2 is formed on the n-InP substrate 1.

Figure 22:
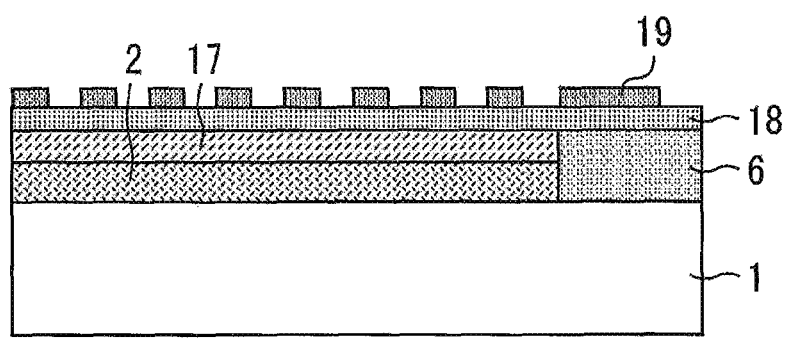
Figure 23:
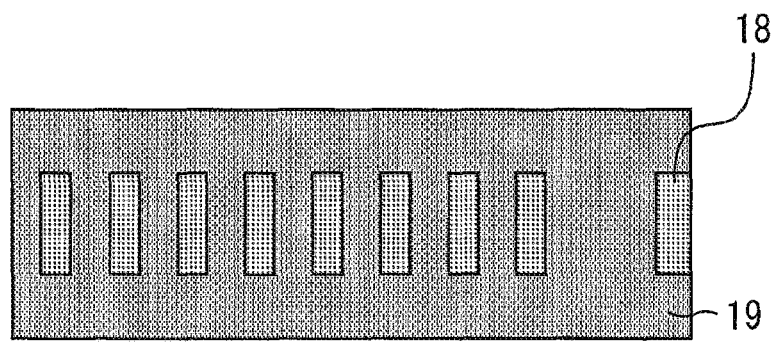
Figure 24:
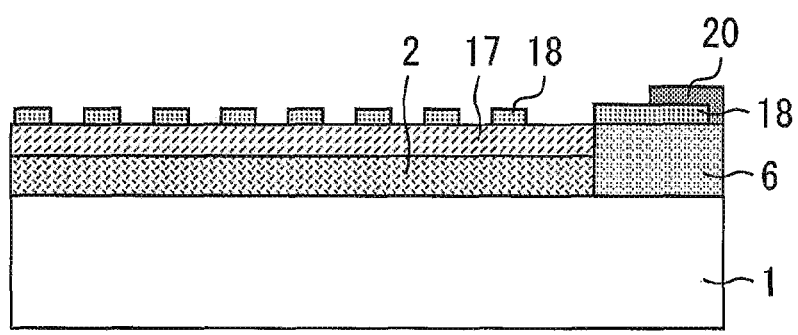
Figure 25:
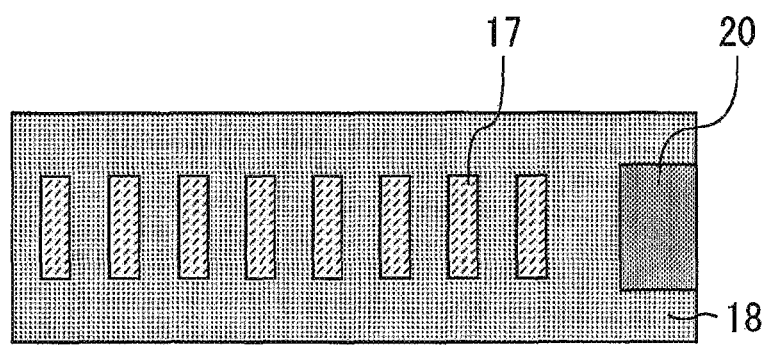

Next, as shown in FIG. 22 and FIG. 23, the first insulating film 18 of $SiO_2$ is formed on the diffraction grating formation layer 17 and the InP layer 6. The resist 19 is formed on the first insulating film 18 and the resist 19 is patterned by electron beam lithography. Next, as shown in FIG. 24 and FIG. 25, the first insulating film 18 is etched using the resist 19 as a mask. By this means, a diffraction grating pattern is formed in the first insulating film 18 on the active layer 2 by electron beam lithography, and at the same time, an end facet formation pattern whose end corresponds to the position of the emission end facet of the window section is formed in the first insulating film 18 on the InP layer 6 by electron beam lithography. After that, the resist 19 is removed and the second insulating film 20 of SiN is formed on the end facet formation pattern of the first insulating film 18.

Figure 26:
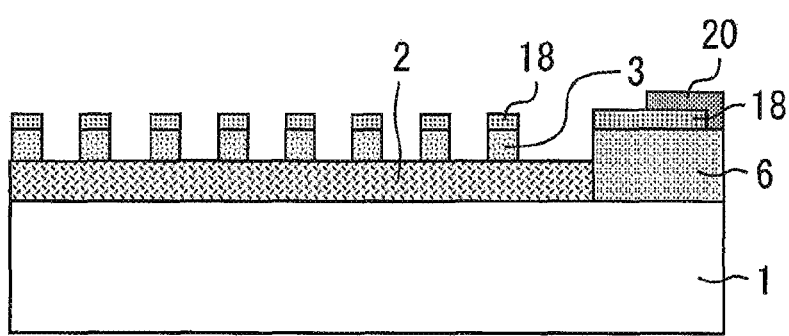
Figure 27:
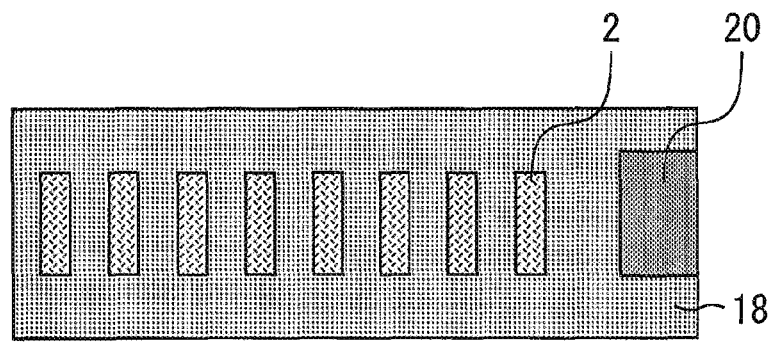
Figure 28:
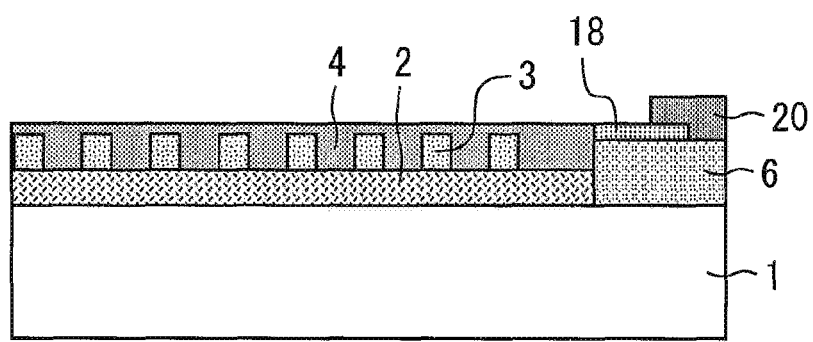
Figure 29:
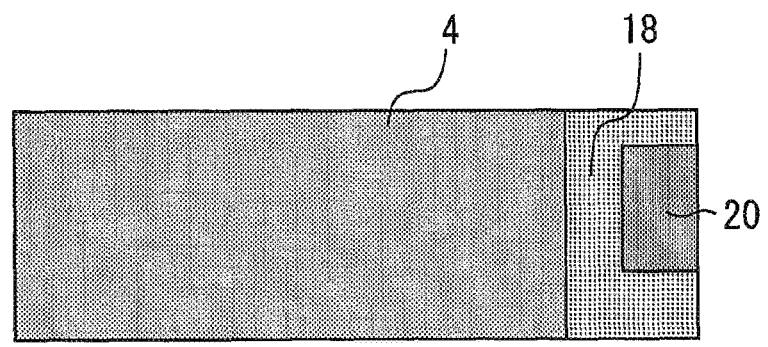

Next, as shown in FIG. 26 and FIG. 27, the diffraction grating formation layer 17 is etched using the first and second insulating films 18 and 20 as masks to form the diffraction grating 3. Next, as shown in FIG. 28 and FIG. 29, the first insulating film 18 on the diffraction grating 3 is removed and the diffraction grating 3 is embedded with the embedded layer 4 while leaving the first and second insulating films 18 and 20 on the InP layer 6.

Figure 30:
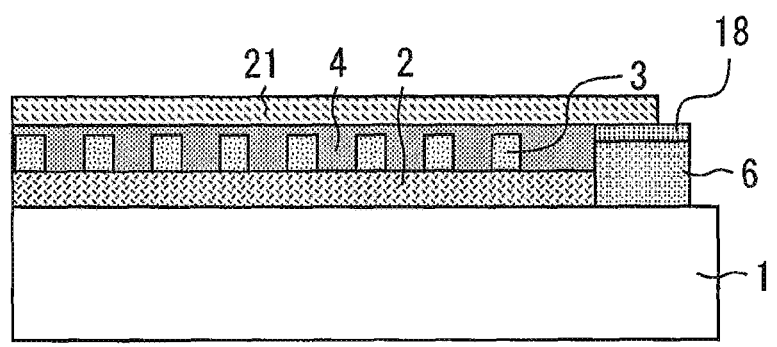
Figure 31:
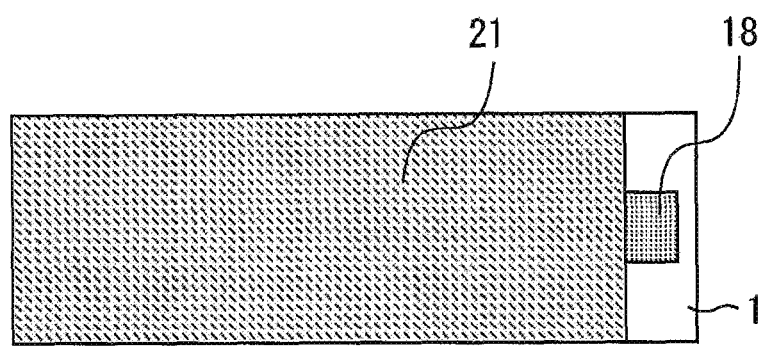
Figure 32:
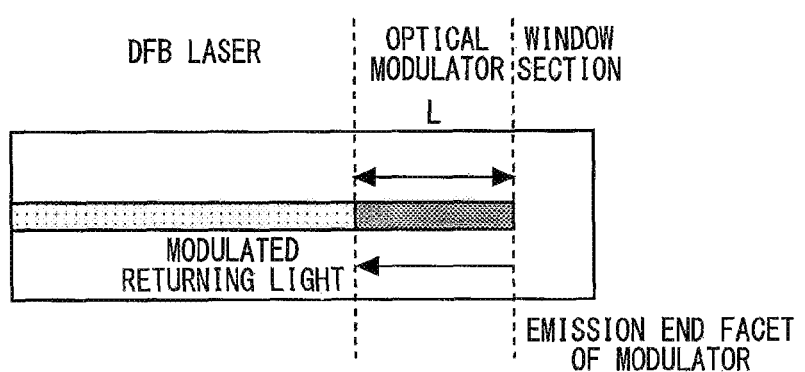
FIG. 32 is a plan view illustrating an electric field absorption type optical modulator integrated semiconductor laser.

Next, as shown in FIG. 30 and FIG. 31, the second insulating film 20 is removed and the third insulating film 21 is formed on the diffraction grating 3 and the embedded layer 4 so as not to cover the end facet formation pattern. Next, the InP layer 6 is etched using the first and third insulating films 18 and 21 as masks to form the emission end facet of the window section. After that, the upper cladding layer 7 or the like is formed on the active layer 2. The upper cladding layer 7 or the like is dry-etched to form a vertical ridge type structure.

In the present embodiment, the diffraction grating pattern is formed by electron beam lithography and at the same time, the end facet formation pattern whose end portion corresponds to the position of the emission end facet of the window section is formed by electron beam lithography. It is thereby possible to control the distance between the end of the diffraction grating 3 and the emission end facet of the window section at nm levels. Therefore, it is possible to control the phase of light when reflected light from the emission end facet of the window section, that is, the front end facet of the optical device enters the DFB laser and obtain the DFB laser with a small wavelength change under the influence of returning light.

More specifically, the distance L between the end of the diffraction grating 3 and the emission end facet of the window section is set as follows.

$$L=(m+a)\lambda/2$$

where $\lambda$ is a guide wavelength of laser light, m is an integer, $-0.1-b \leq a \leq 0.1-b$, and b is a phase of returning light from the front end facet provided with a multi-layer coated insulating film. When the distance L is set as described above, the phase of the returning light when the returning light from the emission end facet of the window section enters the active region of the DFB laser is approximately 0° or 180° for a standing wave in the DFB laser (e.g., see Non Patent Literature 1). For this reason, a single mode characteristic of oscillating wavelength of the laser becomes smaller, never resulting in a problem that the transmission characteristic may deteriorate.

Note that the emission end facet of the window section may be a rear end facet of the optical device. It is thereby possible to control the distance between the end of the diffraction grating 3 of the DFB laser and the rear end facet of the optical device at nm levels. In this way, the present invention is also applicable to a case where the rear end facet of the optical device is formed not by cleavage but by etching.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-155807, filed on Aug. 8, 2016 including specification, claims, drawings and summary, on which the Convention priority of the present application is based, is incorporated herein by reference in its entirety.

The invention claimed is:

1. A method for manufacturing an optical device comprising:
   forming an active layer and a diffraction grating formation layer which become a distributed feedback (DFB) laser in order on a substrate;
   removing part of the active layer and the diffraction grating formation layer and forming an optical absorption layer which becomes an optical modulator butt-jointed to the active layer on the substrate;
   forming a first insulating film on the diffraction grating formation layer and the optical absorption layer;
   forming a diffraction grating pattern in the first insulating film on the diffraction grating formation layer by electron beam lithography, and at the same time forming an end facet formation pattern whose end portion corresponds to a position of an emission end facet of the optical modulator in the first insulating film on the optical absorption layer by electron beam lithography;
   forming a second insulating film on the end facet formation pattern of the first insulating film;
   etching the diffraction grating formation layer using the first and second insulating films as masks to form a diffraction grating;
   removing the first insulating film on the diffraction grating and embedding the diffraction grating with an embedded layer while leaving the first and second insulating films on the optical absorption layer;
   removing the second insulating film and forming a third insulating film on the diffraction grating and the embedded layer not to cover the end facet formation pattern; and
   etching the optical absorption layer using the first and third insulating films as masks to form the emission end facet of the optical modulator.

2. The method for manufacturing an optical device according to claim 1, further comprising embedding a semiconductor layer in a portion where the optical absorption layer is etched to form a window section or a passive waveguide.

3. The method for manufacturing an optical device according to claim 1, further comprising forming an upper cladding layer on the active layer and dry-etching the upper cladding layer to form a vertical ridge type structure.

4. A method for manufacturing an optical device comprising:
   forming an active layer and a diffraction grating formation layer which become a distributed feedback (DFB) laser in order on a substrate;
   removing part of the active layer and the diffraction grating formation layer and forming a semiconductor layer which becomes a window section butt-jointed to the active layer on the substrate;
   forming a first insulating film on the diffraction grating formation layer and the semiconductor layer;
   forming a diffraction grating pattern in the first insulating film on the diffraction grating formation layer by electron beam lithography, and at the same time forming an end facet formation pattern whose end portion corresponds to a position of an emission end facet of the window section in the first insulating film on the semiconductor layer by electron beam lithography;
   forming a second insulating film on the end facet formation pattern of the first insulating film;
   etching the diffraction grating formation layer using the first and second insulating films as masks to form a diffraction grating;
   removing the first insulating film on the diffraction grating and embedding the diffraction grating with an embedded layer while leaving the first and second insulating films on the semiconductor layer;
   removing the second insulating film and forming a third insulating film on the diffraction grating and the embedded layer not to cover the end facet formation pattern; and
   etching the semiconductor layer using the first and third insulating films as masks to form the emission end facet of the window section.

5. The method for manufacturing an optical device according to claim 4, further comprising forming an upper cladding layer on the active layer and dry-etching the upper cladding layer to form a vertical ridge type structure.

* * * * *